(12) United States Patent
Wu et al.

(10) Patent No.: US 9,709,335 B2
(45) Date of Patent: Jul. 18, 2017

(54) DISPATCH CONTROL METHOD FOR FURNACE PROCESS

(71) Applicant: Powerchip Technology Corporation, Hsinchu (TW)

(72) Inventors: Jyun-Da Wu, Taoyuan County (TW); Shih-Tsung Hsiao, Hsinchu (TW); Chien-Chung Chen, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 540 days.

(21) Appl. No.: 14/510,122

(22) Filed: Oct. 9, 2014

(65) Prior Publication Data

US 2016/0025414 A1    Jan. 28, 2016

(30) Foreign Application Priority Data

Jul. 28, 2014 (TW) .............................. 103125690 A

(51) Int. Cl.
| | |
|---|---|
| *G06F 19/00* | (2011.01) |
| *F27D 19/00* | (2006.01) |
| *G05B 19/418* | (2006.01) |
| *H01L 21/67* | (2006.01) |
| *H01L 21/677* | (2006.01) |

(52) U.S. Cl.
CPC ........... *F27D 19/00* (2013.01); *G05B 19/418* (2013.01); *H01L 21/67253* (2013.01); *H01L 21/67778* (2013.01); *G05B 2219/45031* (2013.01); *G05B 2219/45132* (2013.01); *Y02P 90/20* (2015.11)

(58) Field of Classification Search
None
See application file for complete search history.

(56) References Cited

U.S. PATENT DOCUMENTS 4,976,613 A * 12/1990 Watanabe ............... C30B 35/00
414/940
5,818,716 A * 10/1998 Chin ................ G05B 19/41865
257/E21.525
2005/0071038 A1    3/2005 Strang
(Continued)

FOREIGN PATENT DOCUMENTS

| JP | 2004510338 | 4/2004 |
|---|---|---|
| TW | 200412518 | 7/2004 |
| TW | 200537557 | 11/2005 |

OTHER PUBLICATIONS

"Office Action of Japan Counterpart Application," issued on Jul. 5, 2016, p. 1-p. 2, in which the listed reference was cited.
(Continued)

*Primary Examiner* — Philip Wang
(74) *Attorney, Agent, or Firm* — Jianq Chyun IP Office

(57) ABSTRACT

A dispatch control method for a furnace process including the following steps is provided. Before a plurality of lots of wafers is loaded into a furnace, the characteristic variation value of each of the plurality of lots of wafers is calculated. The plurality of lots of wafers is ordered according to the size of the characteristic variation values. The plurality of lots of wafers is placed in the furnace in a descending order of the characteristic variation values corresponding to a plurality of locations in the furnace causing the characteristic variation values to change from smaller to larger.

10 Claims, 2 Drawing Sheets

(56) References Cited

U.S. PATENT DOCUMENTS

| | | | |
|---|---|---|---|
| 2005/0256599 A1* | 11/2005 | Peng | G06Q 10/06 700/100 |
| 2008/0306623 A1* | 12/2008 | Kang | G05B 19/41875 700/121 |
| 2010/0061828 A1* | 3/2010 | Asari | H01L 21/68707 414/160 |
| 2011/0264256 A1 | 10/2011 | Cheng et al. | |

OTHER PUBLICATIONS

"Office Action of Taiwan Counterpart Application," issued on Jun. 17, 2015, p. 1-p. 5, in which the listed references were cited.

\* cited by examiner

DISPATCH CONTROL METHOD FOR FURNACE PROCESS

CROSS-REFERENCE TO RELATED APPLICATION

This application claims the priority benefit of Taiwan application serial no. 103125690, filed on Jul. 28, 2014. The entirety of the above-mentioned patent application is hereby incorporated by reference herein and made a part of this specification.

BACKGROUND OF THE INVENTION

Field of the Invention

The invention relates to a semiconductor processing method, and more particularly, to a dispatch control method for a furnace process.

Description of Related Art

In the manufacturing process of an integrated circuit, many steps need to be performed in a high-temperature environment, and examples of the manufacturing process include a thermal oxidation process for growing an oxide layer. In the above heat treatment method, a wafer is generally placed in a wafer boat and sent into a furnace to react.

The batch furnace process causes variation to the electrical properties or the physical properties of wafers placed in different locations due to loading effect.

SUMMARY OF THE INVENTION

The invention provides a dispatch control method for a furnace process capable of reducing characteristic variation among the products of a plurality of lots of wafers.

The invention provides a dispatch control method for a furnace process including the following steps. Before a plurality of lots of wafers is loaded into a furnace, the characteristic variation value of each of the plurality of lots of wafers is calculated. The plurality of lots of wafers is ordered according to the size of the characteristic variation values. The plurality of lots of wafers is placed in the furnace in a descending order of the characteristic variation values corresponding to a plurality of locations in the furnace causing the characteristic variation values to change from smaller to larger.

According to an embodiment of the invention, the dispatch control method for a furnace process further includes the following step. Before the plurality of lots of wafers is loaded into the furnace, a characteristic parameter value related to a product is defined.

According to an embodiment of the invention, in the dispatch control method for a furnace process, the characteristic parameter value is, for instance, a threshold voltage, a saturation current, or a resistance value.

According to an embodiment of the invention, in the dispatch control method for a furnace process, the characteristic variation values can be calculated from a function of the characteristic variation values, and the function of the characteristic variation values is, for instance, related to at least one of a gate length and a thickness of a residual silicon oxide used for forming a source and a drain.

According to an embodiment of the invention, the dispatch control method for a furnace process further includes the following step. A selection is performed on the ordered plurality of lots of wafers.

According to an embodiment of the invention, in the dispatch control method for a furnace process, a method of performing the selection on the plurality of lots of wafers includes performing the selection on the ordered plurality of lots of wafers according to an average lot size interval.

According to an embodiment of the invention, in the dispatch control method for a furnace process, a method of performing the selection on the plurality of lots of wafers includes providing a lot number to each of the ordered plurality of lots of wafers in order, and selecting the lot number by rounding a value calculated according to the following formula:

$$\text{Lot number} = 1 + \left[ \frac{(\text{Total lot size of a pluraqlity of lots of wafers} - 1) \times N}{\text{Maximum lot size of a batch} - 1} \right]$$

wherein N is an integer of at least 0, and the maximum value of N is one less than the maximum lot size of a batch.

According to an embodiment of the invention, in the dispatch control method for a furnace process, the characteristic variation values of the plurality of lots of wafers can be calculated via an advanced process control (APC) system.

According to an embodiment of the invention, in the dispatch control method for a furnace process, the placement location of each of the plurality of lots of wafers in a batch in the furnace can be decided via a dispatch system.

According to an embodiment of the invention, in the dispatch control method for a furnace process, the dispatch of the plurality of lots of wafers can be executed via a manufacturing execution system (MES).

Based on the above, since in the dispatch control method for a furnace process of the invention, the plurality of lots of wafers is placed in the furnace in a descending order of the characteristic variation values corresponding to a plurality of locations in the furnace causing the characteristic variation values to change from smaller to larger, the characteristic variation caused by a pre-process and the characteristic variation caused by the furnace process can be interacting with each other to compensate or reduce the characteristic variation. As a result, characteristic variation among the products of the plurality of lots of wafers can be reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1:
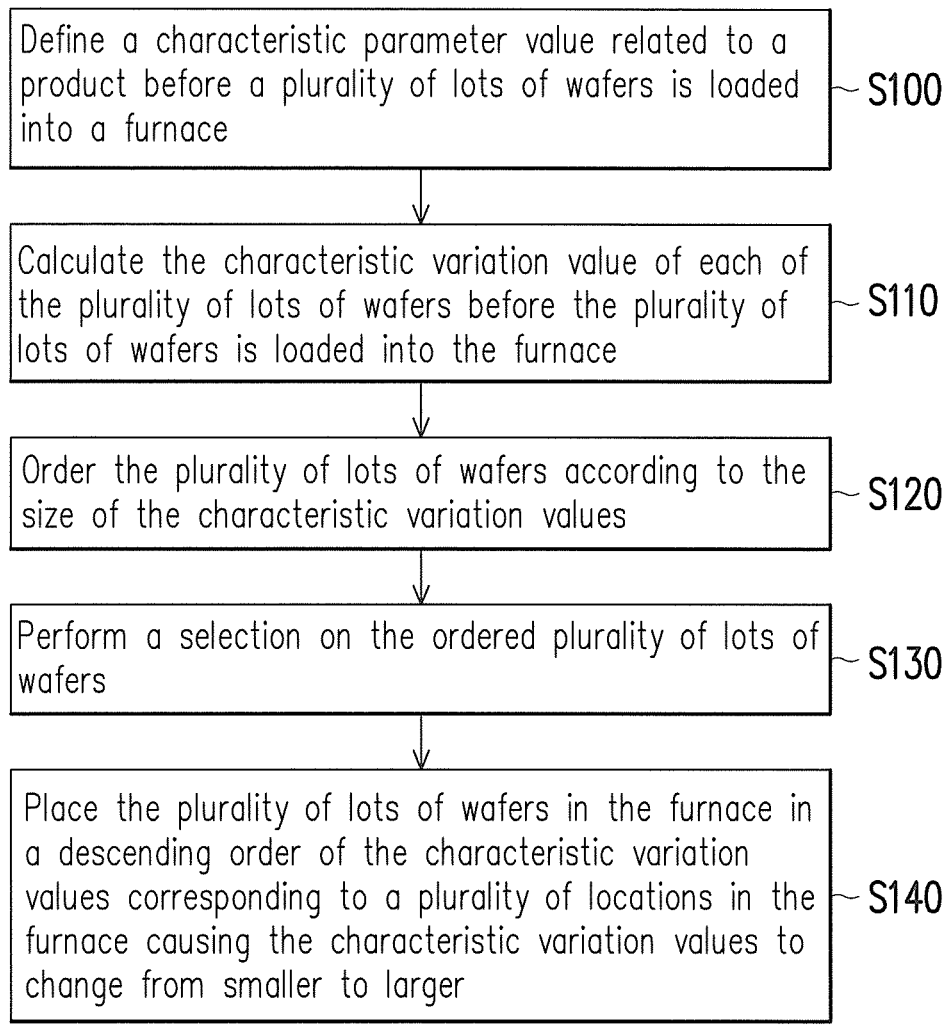
FIG. 1 is a flowchart of a dispatch control method for a furnace process according to an embodiment of the invention.
Figure 2:
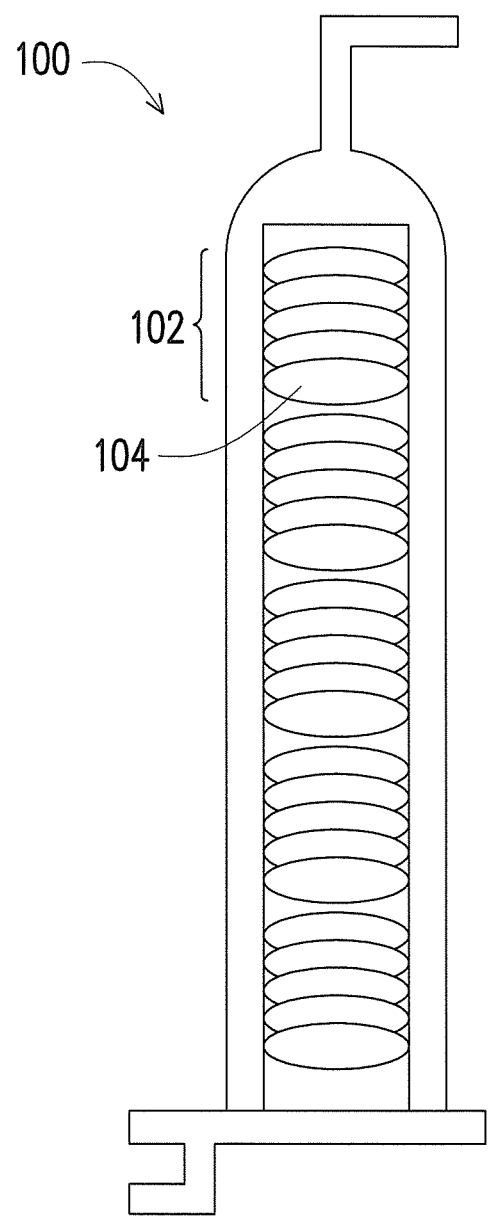
FIG. 2 is a schematic diagram of a furnace according to an embodiment of the invention.

FIG. 1 is a flowchart of a dispatch control method for a furnace process according to an embodiment of the invention. FIG. 2 is a schematic diagram of a furnace according to an embodiment of the invention.

Referring to FIG. 1, the dispatch control method for a furnace process of the present embodiment includes the following steps. Step S100 can be optionally performed, wherein before a plurality of lots of wafers is loaded into a furnace, a characteristic parameter value related to a product is defined. The characteristic parameter value is, for instance, a characteristic parameter value related to the electrical properties or the physical properties of a product, such as a threshold voltage, a saturation current, or a resistance value.

Step S110 is performed, wherein before the plurality of lots of wafers is loaded into the furnace, the characteristic variation value of each of the plurality of lots of wafers is calculated. The characteristic variation values can be calculated from a function of the characteristic variation values, wherein the function of the characteristic variation values is, for instance, related to at least one of a gate length and a thickness of a residual silicon oxide used for forming a source and a drain. In an embodiment, the characteristic variation values of the plurality of lots of wafers can be calculated via an advanced process control system.

Step S120 is performed, wherein the plurality of lots of wafers is ordered according to the size of the characteristic variation values. The ordering method can be performed in a descending manner or an ascending manner.

Step S130 can be optionally performed, wherein a selection is performed on the ordered plurality of lots of wafers. A method of performing the selection on the plurality of lots of wafers includes performing the selection on the ordered plurality of lots of wafers according to an average lot size interval.

In an embodiment, a method of performing the selection on the plurality of lots of wafers includes providing a lot number to each of the ordered plurality of lots of wafers in order, and selecting the lot number by rounding a value calculated according to the following formula:

$$\text{Lot number} = 1 + \left[ \frac{(\text{Total lot size of a pluraqlity of lots of wafers} - 1) \times N}{\text{Maximum lot size of a batch} - 1} \right]$$

wherein N is an integer of at least 0, and the maximum value of N is one less than the maximum lot size of a batch.

For instance, when the total lot size of the plurality of lots of wafers is 10 lots and the maximum lot size of a batch is 4 lots, then in the first batch, N is 0, 1, 2, and 3, and the lot numbers selected according to the above formula are first lot, fourth lot, seventh lot, and tenth lot. After the furnace process of the first batch is performed, six lots remain in the total lot size of the plurality of lots of wafers in the second batch, and lot numbers are re-assigned to the ordered plurality of lots of wafers in order. N is similarly 0, 1, 2, and 3, and the lot numbers selected according to the above formula are first lot, third lot, fourth lot, and sixth lot. After the furnace process of the second batch is performed, the remaining two lots of wafers are selected in the third batch.

It can be known from the above that, when the total lot size of the plurality of lots of wafers is greater than the maximum lot size of a batch, the selection of a plurality of lots of wafers having characteristic variation values all too large or too small when a furnace operation of a batch is performed can be avoided according to the above selection method.

Step S140 is performed, wherein the plurality of lots of wafers is placed in the furnace in a descending order of the characteristic variation values corresponding to a plurality of locations in the furnace causing the characteristic variation values to change from smaller to larger. That is, a lot of wafers having a large characteristic variation value is placed in a location in the furnace causing the characteristic variation value to be smaller, and a lot of wafers having a small characteristic variation value is placed in a location in the furnace causing the characteristic variation value to be larger. Since the loading effect of the furnace causes characteristic variation to wafers at different placement locations, characteristic variation caused by a pre-process can be compensated or reduced by using the characteristic variation caused by the above furnace process via the setting of the placement location of each of the plurality of lots of wafers. As a result, characteristic variation among the products of the plurality of lots of wafers can be reduced.

In an embodiment, the placement location of each of the plurality of lots of wafers in a batch in the furnace can be decided via a dispatch system. Moreover, the dispatch of the plurality of lots of wafers can be executed via a manufacturing execution system.

For instance, referring to FIG. 2, the maximum lot size of a batch in a furnace 100 is five lots 102, wherein one lot 102 includes five wafers 104. That is, a maximum of five lots 102 of wafers 104 can be placed in the furnace operation of a batch, and a total of twenty-five wafers 104 are placed in the furnace 100. The furnace 100 is, for instance, a furnace used to form silicon oxide. However, the invention is not limited thereto, and those having ordinary skill in the art can select the type of the furnace 100 according to process needs. The furnace 100 is, for instance, a vertical furnace or a horizontal furnace. In the present embodiment, the furnace 100 is exemplified as a vertical furnace for description. Moreover, the loading effect of the furnace 100 causes, for instance, variation to properties such as the thickness or the density of the films of the plurality of lots 102 of wafers 104 located at different placement locations. As a result, characteristic variation (such as threshold voltage variation, saturation current variation, or resistance value variation) among the products of the plurality of lots 102 of wafers 104 occurs.

When the locations from top to bottom in the furnace 100 are respectively locations causing the characteristic variation values to change from smaller to larger, the ordered five lots 102 of wafers 104 can be placed in the locations from top to bottom in the furnace 100 in a descending order of the characteristic variation values. On the other hand, when the locations from top to bottom in the furnace 100 are respectively locations causing the characteristic variation values to change from larger to smaller, the ordered five lots 102 of wafers 104 can be placed in the locations from top to bottom in the furnace 100 in an ascending order of the characteristic variation values. In the above embodiments, although the maximum lot size of a batch in the furnace 100 is five lots, the invention is not limited thereto, and those having ordinary skill in the art can decide the maximum lot size of a batch in the furnace 100 according to the specifications and settings of the furnace 100 itself.

It can be known from the above that, since in the dispatch control method for a furnace process provided in the above embodiments, the plurality of lots of wafers is placed in the furnace in a descending order of the characteristic variation values corresponding to a plurality of locations in the furnace causing the characteristic variation values to change from smaller to larger, the characteristic variation caused by a pre-process and the characteristic variation caused by the furnace process can be interacting with each other to compensate or reduce the characteristic variation. As a result, characteristic variation among the products of the plurality of lots of wafers can be reduced.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A dispatch control method for a furnace process, comprising:
   calculating a characteristic variation value of each of a plurality of lots of wafers before the plurality of lots of wafers is loaded into a furnace;
   ordering the plurality of lots of wafers according to a size of the characteristic variation values; and
   placing the plurality of lots of wafers in the furnace in a descending order of the characteristic variation values corresponding to a plurality of locations in the furnace causing the characteristic variation values to change from smaller to larger.

2. The method of claim 1, further comprising defining a characteristic parameter value related to a product before the plurality of lots of wafers is loaded into the furnace.

3. The method of claim 2, wherein the characteristic parameter value comprises a threshold voltage, a saturation current, or a resistance value.

4. The method of claim 1, wherein the characteristic variation values are calculated from a function of the characteristic variation values, and the function of the characteristic variation values is related to at least one of a gate length and a thickness of a residual silicon oxide used for forming a source and a drain.

5. The method of claim 1, further comprising performing a selection on the ordered plurality of lots of wafers.

6. The method of claim 5, wherein a method of performing the selection on the plurality of lots of wafers comprises performing the selection on the ordered plurality of lots of wafers according to an average lot size interval.

7. The method of claim 5, wherein a method of performing the selection on the plurality of lots of wafers comprises providing a lot number to each of the ordered plurality of lots of wafers in order, and selecting the lot number by rounding a value calculated according to the following formula:

$$\text{Lot number} = 1 + \left[ \frac{(\text{Total lot size of a pluraqlity of lots of wafers} - 1) \times N}{\text{Maximum lot size of a batch} - 1} \right]$$

wherein N is an integer of at least 0, and a maximum value of N is one less than a maximum lot size of a batch.

8. The method of claim 1, wherein the characteristic variation values of the plurality of lots of wafers are calculated via an advanced process control system.

9. The method of claim 1, wherein a placement location of each of the plurality of lots of wafers in a batch in the furnace is decided via a dispatch system.

10. The method of claim 1, wherein a dispatch of the plurality of lots of wafers is executed via a manufacturing execution system.

* * * * *